United States Patent
Chiu (12)

(10) Patent No.: US 6,326,647 B1
(45) Date of Patent: Dec. 4, 2001

(54) PACKAGING AND MOUNTING OF SPHERICAL SEMICONDUCTOR DEVICES

(75) Inventor: Anthony M. Chiu, Richardson, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/285,154

(22) Filed: Apr. 1, 1999

(51) Int. Cl.[7] .................. G01S 13/86; H01Q 15/08; H01L 31/02; H01L 33/00; H01L 29/06
(52) U.S. Cl. .................. 257/99; 257/730; 257/723; 257/773; 257/291; 257/686; 257/618; 257/668; 257/738; 257/678; 257/724; 257/684; 257/691; 361/783; 361/736; 361/767; 439/68; 174/52.1
(58) Field of Search .................. 257/690, 678, 257/773, 724, 725, 691, 698, 294, 291, 723, 686, 730, 684, 728, 729, 99, 618, 737, 738, 668; 361/783, 736, 767; 439/68; 174/52.1

(56) References Cited

U.S. PATENT DOCUMENTS

| | | | | |
|---|---|---|---|---|
| 3,596,136 | * | 7/1971 | Fischer. | |
| 4,866,683 | * | 9/1989 | Phillips | 367/157 |
| 5,047,776 | * | 9/1991 | Baller | 342/52 |
| 5,403,773 | * | 4/1995 | Nitta et al. | 385/49 |
| 5,877,943 | * | 3/1999 | Ramamurthi | 257/686 |
| 6,005,401 | * | 12/1999 | Nakata et al. | 324/754 |
| 6,072,163 | * | 6/2000 | Armstron et al. | 438/660 |
| 6,084,574 | * | 7/2000 | Bidiville | 345/166 |

FOREIGN PATENT DOCUMENTS

| | | | |
|---|---|---|---|
| 54-020685 | * | 2/1979 | (JP). |
| 59-021082 | * | 2/1984 | (JP). |
| 07-151940 | * | 6/1995 | (JP). |

* cited by examiner

*Primary Examiner*—Alexander O. Williams
(74) *Attorney, Agent, or Firm*—Lisa K. Jorgenson; Stephen Bongini

(57) ABSTRACT

A spherical semiconductor device that includes at least one circuit element and at least one power pad connecting the circuit element to a supply voltage. The circuit element can communicate with at least one external device through at least one input/output interface. In a preferred embodiment, the at least one input/output interface includes an input pad, an output pad, an optical input interface, and an optical output interface. Another embodiment of the present invention provides a circuit device formed on a circuit board. The circuit device includes power mounting pads, ground mounting pads, external connectors coupled to the pads, and spherical semiconductor devices. Each of the spherical semiconductor devices includes at least one circuit element, at least one power pad connected to one of the power mounting pads, at least one ground pad connected to one of the ground mounting pads, and at least one input/output interface. The circuit element communicates with at least one external device through the input/output interface. In one preferred embodiment of the circuit device, the at least one input/output interface includes an input pad connected to an input mounting pads of the circuit device and an output pad connected to an output mounting pad of the circuit device.

26 Claims, 2 Drawing Sheets

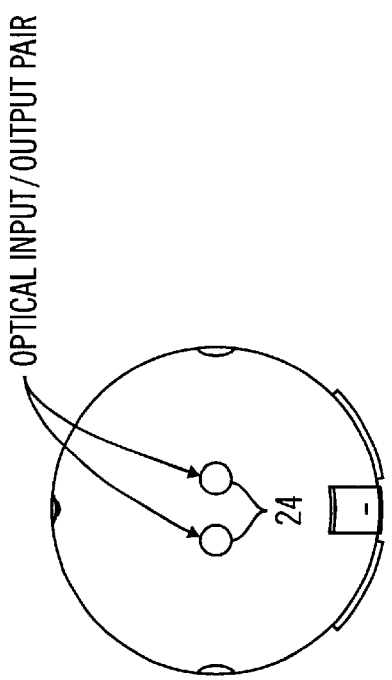
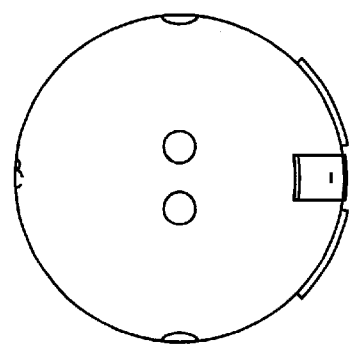
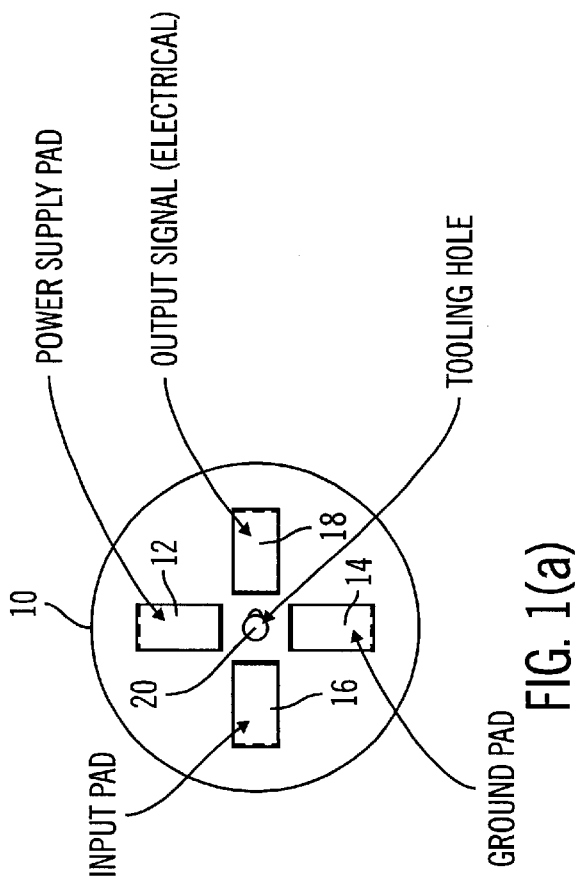
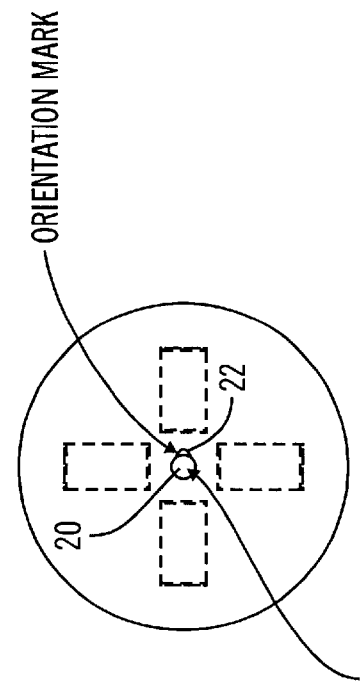

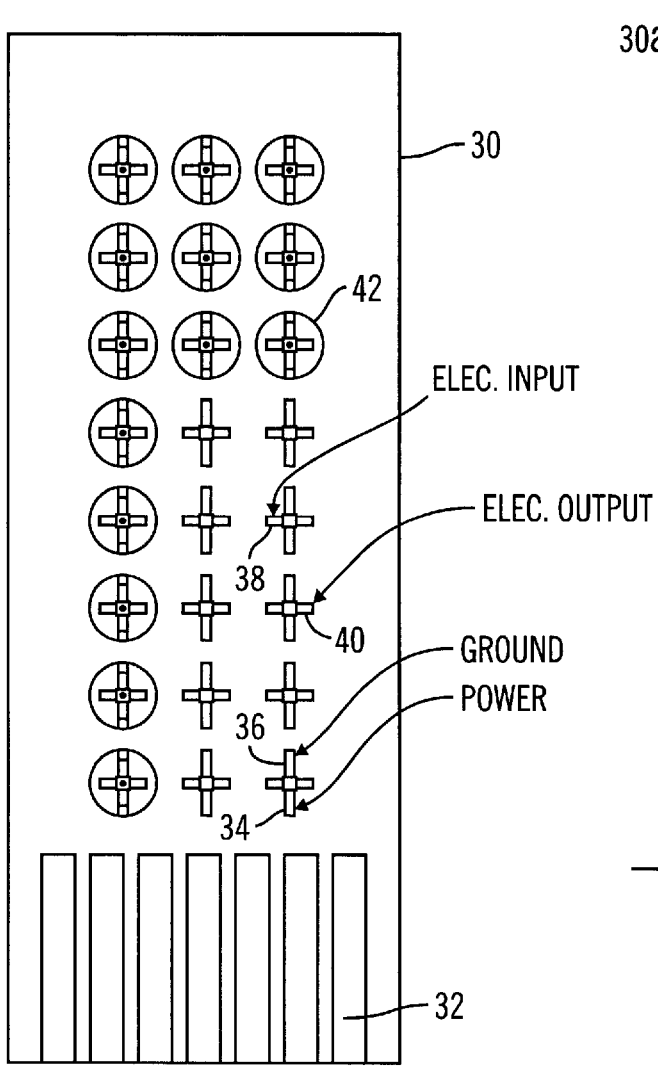
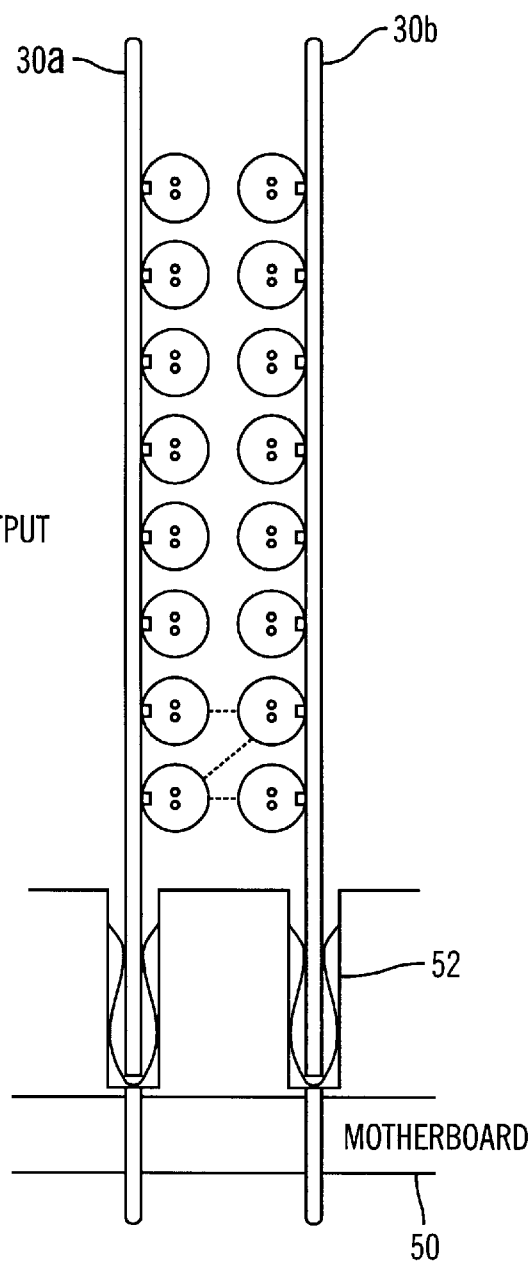
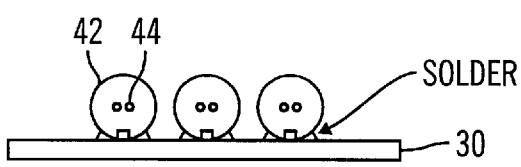
FIG. 2
FIG. 3
FIG. 4

PACKAGING AND MOUNTING OF SPHERICAL SEMICONDUCTOR DEVICES

BACKGROUND OF THE INVENTION

1. Field of the Invention

The present invention relates to spherical semiconductor devices, and more specifically to the packaging and surface mounting of spherical semiconductor integrated circuit devices.

2. Description of Related Art

Conventional integrated circuits (ICs) are fabricated on flat silicon wafers. To begin the fabrication process, silicon is melted to form a large single crystal. The crystal is then cut, polished to a smooth finish, and heated in order to form a silicon wafer, which typically is three to twelve inches in diameter. Next, actual integrated circuits are fabricated on the wafer through a design-specific set of processing steps (such as mask patterning, implantation, deposition, diffusion, and etching). At this point, the ICs on the wafer are tested a first time to determine if each is operational. Then, the wafer is diced to separate the individual ICs, and the operational ICs are packaged in a plastic or ceramic molding to form a "chip." The packaged ICs are then tested once again to insure that the completed device is functioning properly.

In such a wafer-based fabrication process, the number of ICs that are produced on each wafer depends on the size of the wafer and the size of the IC being fabricated. Recently, the wafer diameter has been increased in order to increase the manufacturing productivity and decrease the cost per IC device. However, each move to a larger wafer necessitates the purchase of expensive new manufacturing equipment and adds process complexity that can increase the defect rate. Further, when a matrix of individual ICs is formed on a wafer, the ICs must be spaced relatively far apart in order to facilitate their separation in the mechanical dicing process. Due to factors such as the required spacing and the defect rate, the aggregate area of the silicon wafer that yields functioning IC devices can be as low as 10%.

In order to overcome such inherent drawbacks in flat wafer-based IC fabrication, it has been proposed to form an IC device on a silicon sphere. According to this manufacturing process, single crystal silicon spheres (e.g., of one millimeter in diameter) are formed, and each sphere is processed so as to create circuit elements on its outer surface. Because such a one millimeter sphere has a surface area of only 3.14 $mm^2$, large VLSI circuits cannot be formed on a single sphere. However, larger circuits can be formed by combining multiple spheres in to a single device. In this respect, each sphere can be designed as a portion of a system (e.g., a RAM, ROM, logic circuit, or I/O circuit), and the spherical devices can be connected together to form a complete VLSI circuit. Additionally, the individual spheres can be designed to be "standardized" circuit portions to further simply the device manufacturing process.

The manufacturing of ICs as silicon spheres offers many advantages over conventional flat wafer rectangular ICs. For example, the processing of individual spheres significantly cuts the cycle time needed to form a final device and allows for single devices to be processed (as opposed to batch processing of devices on a wafer). Further, such spherical IC device manufacturing processes can greatly decrease the overall IC device manufacturing cost by eliminating the need for large dedicated clean rooms, by allowing over 90% of the required silicon material to end up in functioning devices, and by eliminating the need to purchase new manufacturing equipment each time technological advances necessitate larger circuit devices. However, while there has been success in fabricating circuit elements on silicon spheres, packaging and mounting schemes are needed in order to allow spherical IC devices to be incorporated into complete systems such as computers and mobile phones.

SUMMARY OF THE INVENTION

It is an object of the present invention to provide packaged spherical semiconductor devices that are usable in a system and that can communicate with other devices in the system. A spherical semiconductor device includes at least one circuit element, at least one power pad, and at least one input/output interface. The circuit element is powered through a coupling with the power pad, and the circuit element communicates with other spherical devices or other system elements through the input/output interface. Thus, the spherical device can be combined with other spherical devices and/or mounted into a complete electronic system.

One embodiment of the present invention provides a spherical semiconductor device that includes at least one circuit element and at least one power pad connecting the circuit element to a supply voltage. Additionally, the circuit element can communicate with at least one external device through at least one input/output interface. In a preferred embodiment, the at least one input/output interface includes an input pad, an output pad, an optical input interface, and an optical output interface.

Another embodiment of the present invention provides a circuit device formed on a printed circuit board. The circuit device includes power mounting pads connected to a supply voltage, ground mounting pads connected to ground, external connectors coupled to the pads through lines, and spherical semiconductor devices. Each of the spherical semiconductor devices includes at least one circuit element, at least one power pad connected to one of the power mounting pads, at least one ground pad connected to one of the ground mounting pads, and at least one input/output interface. The circuit element communicates with at least one external device through the input/output interface. In one preferred embodiment of the circuit device, the circuit device also includes input mounting pads and output mounting pads, and the at least one input/output interface includes an input pad connected to one of the input mounting pads and an output pad connected to one of the output mounting pads.

Yet another embodiment of the present invention provides an electronic system having a first printed circuit board. The first printed circuit board includes power mounting pads connected to a supply voltage, ground mounting pads connected to ground, external connectors coupled to the pads through lines, and spherical semiconductor devices. Each of the spherical semiconductor devices includes at least one circuit element, at least one power pad connected to one of the power mounting pads, at least one ground pad connected to one of the ground mounting pads, and at least one input/output interface for communicating with at least one external device. In a preferred embodiment of the system, the electronic system includes two such printed circuit boards that are connected to connection sockets of a motherboard, and at least one of the spherical semiconductor devices of one printed circuit board can communicate with at least one of the spherical semiconductor devices of the other printed circuit board through optical input and output interfaces.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIGS. 1(a) through 1(d) are diagrams showing a spherical semiconductor device according to a preferred embodiment of the present invention;

FIG. 2 is a diagram showing a front view of a printed circuit board for mounting the spherical semiconductor devices;

FIG. 3 is a diagram showing a side view of the printed circuit board of FIG. 2; and FIG. 4 is a circuit diagram showing a portion of an electronic system that includes two of the printed circuit boards of FIGS. 2 and 3.

DETAILED DESCRIPTION OF PREFERRED EMBODIMENTS

Preferred embodiments of the present invention will be described in detail hereinbelow with reference to the attached drawings.

FIGS. 1(a) through 1(d) show a spherical semiconductor device according to a preferred embodiment of the present invention. As shown, the spherical device 10 has tooling holes 20 and orientation marks 22. The tooling holes 20 are dimples that are used as contact regions between the sphere 10 and a gripping instrument (not shown) during the manufacturing of the device. In particular, the gripping instrument attaches to the sphere 10 in the vicinity of one or more of the tooling holes 20 in order to hold the sphere during processing steps for fabricating circuit elements and the like on the surface of the sphere. The gripping instrument can also turn the sphere 10 during processing to allow different portions of the surface to be processed at different times. While the illustrated embodiment includes multiple tooling holes, further embodiments include from one to many tooling holes based on the processing equipment and processes being used and the circuitry being fabricated on the device.

The orientation mark 22 is a small slot at the periphery of a predetermined side of a tooling hole 20, as shown in FIG. 1(b). The orientation mark acts as an indicator for proper aligning of the spherical device during manufacturing and assembly, and is especially useful for insuring the same alignments when using multiple machines or multiple processes. For example, the mechanical orientation marks 22 of the preferred embodiment are indentations on the edge of two of the tooling holes 20 that are used to align the sphere to the photolithography equipment during fabrication and as a directional reference on the device during circuit assembly. Further embodiments of the present invention have orientation marks formed as markings or cut-outs within, on the periphery of, or adjacent to one or more of the tooling holes of the device.

Additionally, the spherical device 10 includes metallized pads that allow electrical communication with other devices in an electronic system. The device of FIG. 1(a) includes a power pad 12, a ground pad 14, an input pad 16, and an output pad 18. The power pad 12 and ground pad 14 respectively connect the device to the supply voltage and ground of an electrical power supply. The input pad 16 receives an external electrical signal for processing within the device, and the output pad 18 supplies an output signal generated by the device. The pads are formed by coating nickel over a copper or aluminum conducting layer of the device and are arranged so as to allow connection with other devices or a circuit board.

In the illustrated embodiment, one pad of each type is arranged on one side of the device to allow for easy connection (e.g., through soldering) to a circuit board. However, in further embodiments, the number, location, and material of the pads is dependent on the function performed by the device and the type of system that incorporates the device. In other words, any conducting material can be used to form any number of pads located anywhere on the exterior of the device. For example, in one embodiment of the present invention, input and output pads are located on opposite sides of the device to allow the device to be connected between two other spherical devices.

Optical input and output interfaces 24 are also provided on the spherical device 10, as shown in FIGS. 1(c) and 1(d). Each pair of optical interfaces 24 allows non-contact communication with an external device such as another spherical device. In the preferred embodiment, four optical interface pairs are spaced around a circumference of the spherical device 10, and each optical interface pair is formed by a light-emitting diode and an adjacent phototransistor. The light-emitting diode transmits an output signal as an external optical signal (e.g., at an infrared, visible, or ultraviolet wavelength), and the phototransistor receives a similar optical input signal from an external device. Further embodiments of the present invention have any number of optical input interfaces and optical output interfaces located on the exterior of the device as required by the design of the device itself and the system incorporating the device.

FIG. 2 shows a front view and FIG. 3 shows a side of the spherical semiconductor devices of embodiments of the present invention mounted on a printed circuit board. The printed circuit board 30 has metal-plated connectors 32 that are coupled to mounting pads for the spherical devices 42 by conducting lines. In the illustrated embodiment, the circuit board has an array of spherical device connection points, with each of the connection points including a power supply mounting pad 34, ground mounting pad 36, input mounting pad 38, and output mounting pad 40 arranged in a standard configuration.

Each of the spherical devices is surface-mounted to the circuit board through corresponding pads 12, 14, 16, and 18 that are soldered to the mounting pads 34, 36, 38, and 40 of one of the connection points. Each spherical device can be encased in plastic, epoxy, or resin to protect it from the environment. During operation, the circuit elements. of the spherical devices 42 communicate with one another and with external devices (not shown) through the lines of the circuit board, which are layered and separated by dielectrics in a conventional manner. Additionally, the spherical devices 42 can communicate with adjacent spherical devices through the optical input and output interfaces 44, as shown in FIG. 3. Some embodiments have the circuit board 30 containing all of the circuitry for the system, and other embodiments have the circuit board connected to other circuit boards (e.g., a motherboard) that contain other portions of the system.

FIG. 4 shows a portion of an electronic system that includes two circuit boards containing spherical semiconductor devices according to embodiments of the present invention. The connectors 32 of each circuit board 30a and 30b are inserted into a socket 52 of a motherboard 50. As described above, the pads of the spherical devices are soldered to the mounting pads of the motherboard, and lines connect the mounting pads to the connectors. Thus, during system operation, the motherboard supplies power to the circuit elements that form the integrated circuit of each spherical device 42 through the power and ground pads 12 and 14 of the device.

Similarly, other devices (i.e., spherical devices and other circuit devices) in the electronic system (i.e., on the motherboard or any connected circuit board) can supply an electrical input signal to and receive an electrical output signal from one of the spherical devices 42 though its input and output pads 16 and 18, respectively. The spherical devices 42 mounted on one of the circuit boards 30 can also communicate with adjacent spherical devices on the circuit board through their optical input and output interfaces 24, as explained above. Furthermore, by properly aligning and distancing the circuit boards, the optical input and output interfaces 24 can be used for communication between spherical devices on different circuit boards, as shown in FIG. 4.

Accordingly, the present invention provides a spherical semiconductor device that can be mounted in a computer or other electronic system. Further, the spherical device can receive power and can electrically and/or optically communicate with other devices in the system. In particular, the circuit elements of the spherical device are powered through a power pad and communicate with external devices through an input/output interface. Thus, the spherical semiconductor device can be mounted and/or combined with other spherical devices to form a larger circuit or system.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, other embodiments of the present invention may not include all of the features described above. Therefore, it is intended that the present invention not be limited to the particular embodiments disclosed, but that the invention include all embodiments falling within the scope of the appended claims.

What is claimed is:

1. A spherical semiconductor device comprising:
    a sphere of a semiconductor material;
    at least one circuit element formed on the sphere;
    at least one power pad formed on the sphere, the power pad connecting the circuit element to a supply voltage; and
    at least one bidirectional input/output interface formed on the sphere, the circuit element bidirectionally communicating with at least one external device through the bidirectional input/output interface,
        wherein the at least one bidirectional input/output interface includes at least one light-emitting diode for transmitting an external optical output signal, and at least one phototransistor for receiving an external optical input signal, the phototransistor and light-emitting diode being formed on the sphere of semiconductor material.

2. The spherical semiconductor device as defined in claim 1, wherein the at least one input/output interface includes an input pad and an output pad.

3. The spherical semiconductor device as defined in claim 2, further comprising a ground pad connecting the circuit element to ground.

4. The spherical semiconductor device as defined in claim 3, wherein the power pad, the ground pad, the input pad, and the output pad are arranged on one side of the sphere to allow the sphere to be soldered to a substantially flat interconnection device.

5. The spherical semiconductor device as defined in claim 1, wherein the at least one input/output interface includes an input/output pad.

6. The spherical semiconductor device as defined in claim 1, wherein the at least one bidirectional input/output interface includes a plurality of optical input/output interface pairs, each of the optical input/output interface pairs including a phototransistor and a light-emitting diode formed on the sphere of semiconductor material.

7. The spherical semiconductor device as defined in claim 6, wherein the at least one input/output interface further includes an input pad and an output pad.

8. A spherical semiconductor device comprising:
    a sphere of a semiconductor material;
    at least one circuit element formed on the sphere;
    at least one power pad formed on the sphere, the power pad connecting the circuit element to a supply voltage;
    at least one input/output interface formed on the sphere, the circuit element communicating with at least one external device through the input/output interface; and
    at least one tooling hole for receiving a gripping instrument so as to allow the gripping instrument to hold the sphere of semiconductor material, the tooling hole being a dimple in the sphere of semiconductor material.

9. The spherical semiconductor device as defined in claim 8, further comprising at least one orientation mark for indicating proper alignment of the device, the orientation mark being located within, on the periphery of, or adjacent to the tooling hole.

10. A circuit device formed on a printed circuit board, said circuit device comprising:
    a plurality of power mounting pads connected to a supply voltage;
    a plurality of ground mounting pads connected to ground;
    a plurality of external connectors, the external connectors being coupled to the pads through lines; and
    a plurality of spherical semiconductor devices, each of the spherical semiconductor devices including:
        a sphere of a semiconductor material;
        at least one circuit element formed on the sphere;
        at least one power pad formed on the sphere, the power pad being connected to one of the power mounting pads;
        at least one ground pad formed on the sphere, the ground pad being connected to one of the ground mounting pads; and
        at least one bidirectional input/output interface formed on the sphere, the circuit element bidirectionally communicating with at least one external device through the bidirectional input/output interface,
            wherein the at least one bidirectional input/output interface includes at least one light-emitting diode for transmitting an external optical output signal, and at least one phototransistor for receiving an external optical input signal, the phototransistor and light-emitting diode being formed on the sphere of semiconductor material.

11. The circuit device as defined in claim 10, further comprising:

a plurality of input mounting pads; and a plurality of output mounting pads, wherein the at least one input/output interface includes an input pad and an output pad, the input pad being connected to one of the input mounting pads and the output pad being connected to one of the output mounting pads.

12. The circuit device as defined in claim 10, wherein the at least one bidirectional input/output interface includes a plurality of optical input/output interface pairs, each of the optical input/output interface pairs including a phototransistor and a light-emitting diode formed on the sphere of semiconductor material.

13. The circuit device as defined in claim 12, further comprising:

a plurality of input mounting pads; and a plurality of output mounting pads, wherein the at least one input/output interface includes an input pad and an output pad, the input pad being connected to one of the input mounting pads and the output pad being connected to one of the output mounting pads.

14. The circuit device as defined in claim 10, wherein each of the spherical semiconductor devices further includes at least one tooling hole for receiving a gripping instrument so as to allow the gripping instrument to hold the device, the tooling hole being a dimple in the sphere of semiconductor material.

15. The circuit device as defined in claim 14, wherein each of the spherical semiconductor devices further includes at least one orientation mark for indicating proper alignment of the device, the orientation mark being located within, on the periphery of, or adjacent to the tooling hole.

16. An electronic system including a first circuit board, the first circuit board comprising:

a plurality of power mounting pads connected to a supply voltage;

a plurality of ground mounting pads connected to ground;

a plurality of external connectors, the external connectors being coupled to the pads through lines; and a plurality of spherical semiconductor devices, each of the spherical semiconductor devices including:

a sphere of a semiconductor material;

at least one circuit element formed on the sphere;

at least one power pad formed on the sphere, the power pad being connected to one of the power mounting pads;

at least one ground pad formed on the sphere, the ground pad being connected to one of the ground mounting pads; and at least one bidirectional input/output interface formed on the sphere, the circuit element bidirectionally communicating with at least one external device through the bidirectional input/output interface, wherein the at least one bidirectional input/output interface includes at least one light-emitting diode for transmitting an external optical output signal, and at least one phototransistor for receiving an external optical input signal, the phototransistor and light-emitting diode being formed on the sphere of semiconductor material.

17. The electronic system as defined in claim 16, wherein the first circuit board further comprises:

a plurality of input mounting pads; and a plurality of output mounting pads, wherein the at least one input/output interface includes an input pad and an output pad, the input pad being connected to one of the input mounting pads and the output pad being connected to one of the output mounting pads.

18. The electronic system as defined in claim 17, wherein the at least one bidirectional input/output interface includes a plurality of optical input/output interface pairs, each of the optical input/output interface pairs including a phototransistor and a light-emitting diode formed on the sphere of semiconductor material.

19. The electronic system as defined in claim 16, wherein each of the spherical semiconductor devices further includes at least one tooling hole for receiving a gripping instrument so as to allow the gripping instrument to hold the device, the tooling hole being a dimple in the sphere of semiconductor material.

20. The electronic system as defined in claim 19, wherein each of the spherical semiconductor devices further includes at least one orientation mark for indicating proper alignment of the device, the orientation mark being located within, on the periphery of, or adjacent to the tooling hole.

21. The electronic system as defined in claim 16, further comprising a second circuit board, the second circuit board comprising:

a plurality of power mounting pads connected to a supply voltage;

a plurality of ground mounting pads connected to ground;

a plurality of external connectors, the external connectors being coupled to the pads through lines; and a plurality of spherical semiconductor devices, each of the spherical semiconductor devices including:

a sphere of a semiconductor material;

at least one circuit element formed on the sphere;

at least one power pad formed on the sphere, the power pad being connected to one of the power mounting pads;

at least one ground pad formed on the sphere, the ground pad being connected to one of the ground mounting pads; and at least one bidirectional input/output interface formed on the sphere, the circuit element bidirectionally communicating with at least one external device through the bidirectional input/output interface, wherein the at least one bidirectional input/output interface includes at least one light-emitting diode for transmitting an external optical output signal, and at least one phototransistor for receiving an external optical input signal, the phototransistor and light-emitting diode being formed on the sphere of semiconductor material.

22. The electronic system as defined in claim 21, further comprising a motherboard having connection sockets, the first and second circuit boards being connected to the motherboard through the connection sockets.

23. The electronic system as defined in claim 22, wherein each of the first and second circuit boards further comprises:

a plurality of input mounting pads; and a plurality of output mounting pads, wherein the at least one input/output interface includes an input pad and an output pad, the input pad being connected to one of the input mounting pads and the output pad being connected to one of the output mounting pads.

24. The electronic system as defined in claim 22, wherein the at least one bidirectional input/output interface includes a plurality of optical input/output interface pairs, each of the optical input/output interface pairs including a phototransistor and a light-emitting diode formed on the sphere of semiconductor material.

25. The electronic system as defined in claim 24, wherein at least one of the spherical semiconductor devices of the first circuit board can communicate with at least one of the spherical semiconductor devices of the second circuit board through the optical input/output interface pairs.

26. The electronic system as defined in claim 25, wherein each of the first and second circuit boards further comprises:

a plurality of input mounting pads; and
a plurality of output mounting pads,
wherein the at least one input/output interface includes an input pad and an output pad, the input pad being connected to one of the input mounting pads and the output pad being connected to one of the output mounting pads.

* * * * *